(12) United States Patent
Conner et al.

(10) Patent No.: US 7,375,978 B2
(45) Date of Patent: May 20, 2008

(54) METHOD AND APPARATUS FOR TRACE SHIELDING AND ROUTING ON A SUBSTRATE

(75) Inventors: John Conner, Chandler, AZ (US); Brian Taggart, Phoenix, AZ (US); Robert Nickerson, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 514 days.

(21) Appl. No.: 10/746,595

(22) Filed: Dec. 23, 2003

(65) Prior Publication Data

US 2005/0133255 A1  Jun. 23, 2005

(51) Int. Cl.
*H05K 1/11* (2006.01)
*H05K 1/14* (2006.01)

(52) U.S. Cl. .................. 361/794; 361/777; 361/778
(58) Field of Classification Search ........ 361/776–778; 257/700–704, 690–692, 730–738
See application file for complete search history.

(56) References Cited

U.S. PATENT DOCUMENTS

| | | | | |
|---|---|---|---|---|
| 5,006,963 A | * | 4/1991 | Spangler et al. | 361/807 |
| 5,061,686 A | * | 10/1991 | Ruby | 505/192 |
| 5,500,555 A | * | 3/1996 | Ley | 257/700 |
| 5,616,952 A | * | 4/1997 | Nakano et al. | 257/659 |
| 6,008,532 A | * | 12/1999 | Carichner | 257/691 |
| 6,054,767 A | * | 4/2000 | Chia et al. | 257/738 |
| 6,538,336 B1 | * | 3/2003 | Secker et al. | 257/786 |

* cited by examiner

*Primary Examiner*—Tuan T. Dinh
(74) *Attorney, Agent, or Firm*—Marger Johnson & McCollom, PC

(57) ABSTRACT

Some embodiments of the invention effectively shield signal traces on a substrate without impacting the signal trace routing on the metal layers of the substrate. Other embodiments of the invention provide improved power delivery without impacting the signal trace routing on the metal layers of the substrate. Other embodiments of the invention are described in the claims.

17 Claims, 6 Drawing Sheets

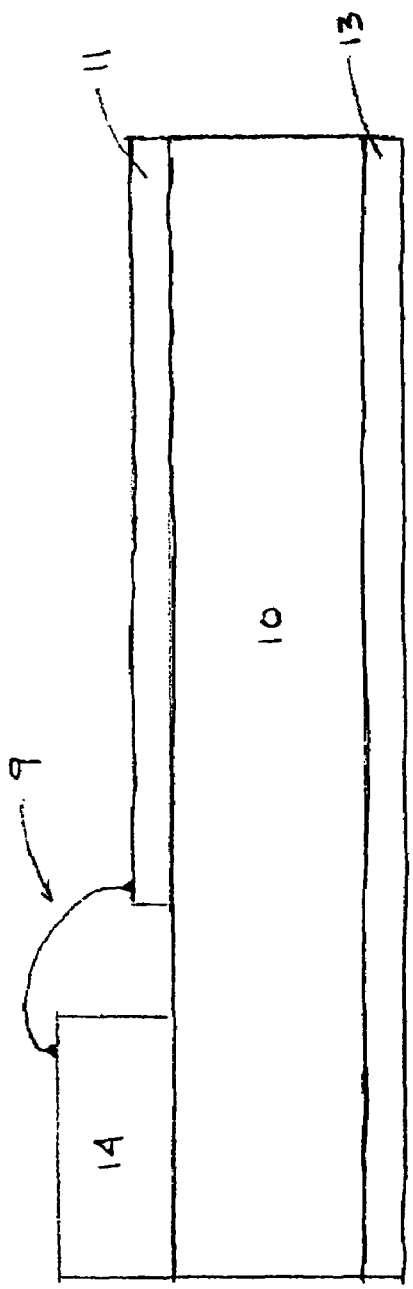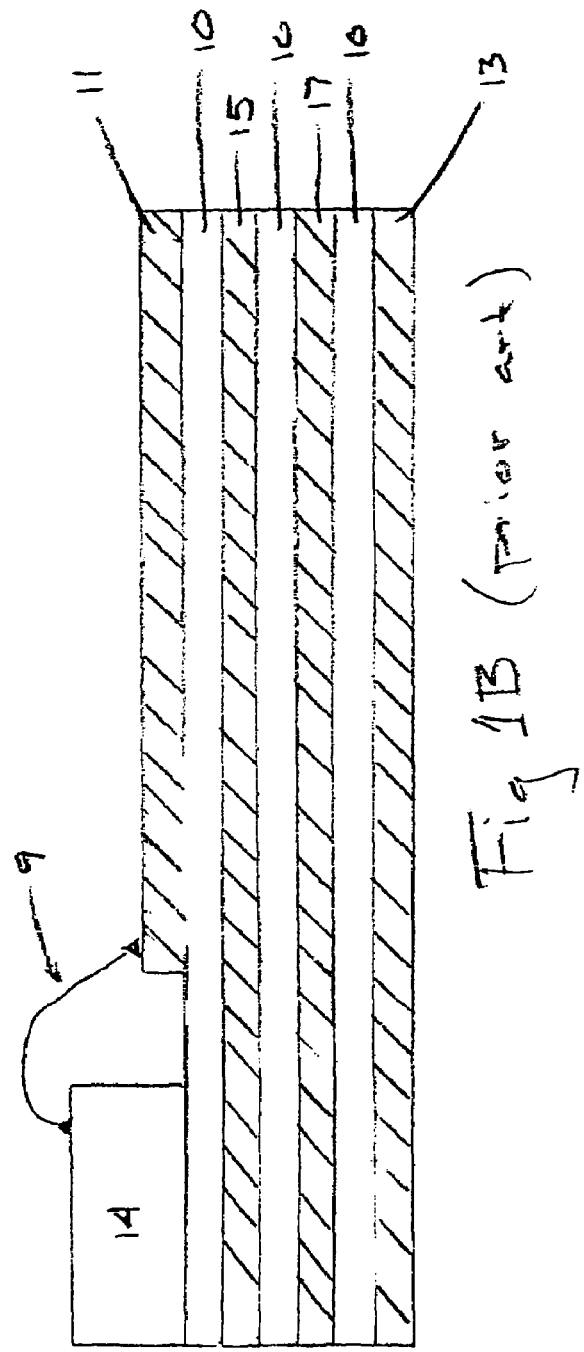

METHOD AND APPARATUS FOR TRACE SHIELDING AND ROUTING ON A SUBSTRATE

BACKGROUND OF THE INVENTION

1. Technical Field of the Invention

This disclosure relates generally to the routing of signal traces on substrates and more particularly to a method and apparatus for providing improved trace shielding on substrates that consumes less circuit real estate.

2. Description of the Related Art

Crosstalk and electromagnetic interference (EMI) are two issues that every electronic system designer is familiar with. With the growing density and speed (as measured by frequency, i.e. Megahertz) of semiconductor devices and widespread use of such devices in wireless communication devices such as cellular phones and personal digital assistants, it becomes increasingly important to shield the signal traces connected to the semiconductor devices to prevent crosstalk and EMI.

FIG. 1A is a cross-sectional diagram illustrating a conventional two-layer substrate. The substrate 10 includes two metal layers 11 and 13. The upper metal layer 11 typically includes a number of signal traces (not shown) that are connected to a semiconductor die 14 by a jumper wire bond 9. The lower metal layer 13 typically includes a number of metal lands (not shown). Signal vias (not shown) connect the signal traces on the upper metal layer 11 to corresponding metal lands on the lower metal layer 13.

FIG. 1B is a cross-sectional diagram illustrating a conventional four-layer substrate. In addition to the elements illustrated in FIG. 1A, the four-layer substrate has two more metal layers 15 and 17. The metal layers 15 and 17 typically function as power or ground planes.

FIG. 2 is a plan diagram illustrating unshielded signal traces on a conventional substrate 10. In this diagram, the signal traces 20 that are part of the metal layer 11 of FIGS. 1A and 1B are illustrated. A number of signal pads 16 are located on the periphery of the die 14. A number of bond fingers 18 are on the substrate 10 surrounding the die 14, each bond finger 18 corresponding to a signal pad 16. The signal traces 20 are formed in contact with a corresponding bond finger 18, which is electrically connected to a corresponding signal pad 16 by a jumper wire bond 9. In FIG. 2, the substrate 10 is flexible and may be folded about the fold region 12.

FIG. 3 is a plan diagram illustrating shielded signal traces on a conventional substrate. FIG. 3 is the same as FIG. 2, except for the fact that each signal trace is routed between a ground trace 34 and a power trace 24. Each of the ground traces 34 and power traces 24 are connected to a ground via 35 or a power via 25, respectively. If the substrate 10 is a four-layer substrate such as that shown in FIG. 1B, each of the ground vias 35 and power vias 25 are connected to the ground plane and power plane, respectively. If the substrate 10 is a two-layer substrate such as the one shown in FIG. 1A, each of the ground vias 35 and power vias 25 must be connected to a metal land that supplies ground and power voltages, respectively.

The shielding scheme illustrated by FIG. 3 is problematic for a variety of reasons. Due to the increased density of semiconductor devices, routing the ground vias 35 and the power vias 25 in the locations shown is almost impossible for a two-layer substrate, since it does not provide a ground plane like the four-layer substrate does. Additionally, the ground vias 35 and the power vias 25 require a significant amount of surface real estate. The diameter of the vias 24 and 35 is typically on the order of 250 µm, which is significantly larger than the width of the signal traces 20. As a result, when placement is attempted between adjacent traces, the vias 24 and 25 tend to short the signal traces 20, as illustrated in FIG. 3.

Embodiments of the invention address these and other disadvantages of the conventional art.

BRIEF DESCRIPTION OF THE DRAWINGS

Embodiments of the invention will be more readily understood with reference to the following drawings, in which like numerals refer to like elements throughout. It will be understood that the drawings are not drawn to scale and dimensions may be exaggerated so as not to obscure the features that are being illustrated.

FIG. 1A is a cross-sectional diagram illustrating a conventional two-layer substrate.

FIG. 1B is a cross-sectional diagram illustrating a conventional four-layer substrate.

DETAILED DESCRIPTION OF THE INVENTION

Figure 4:
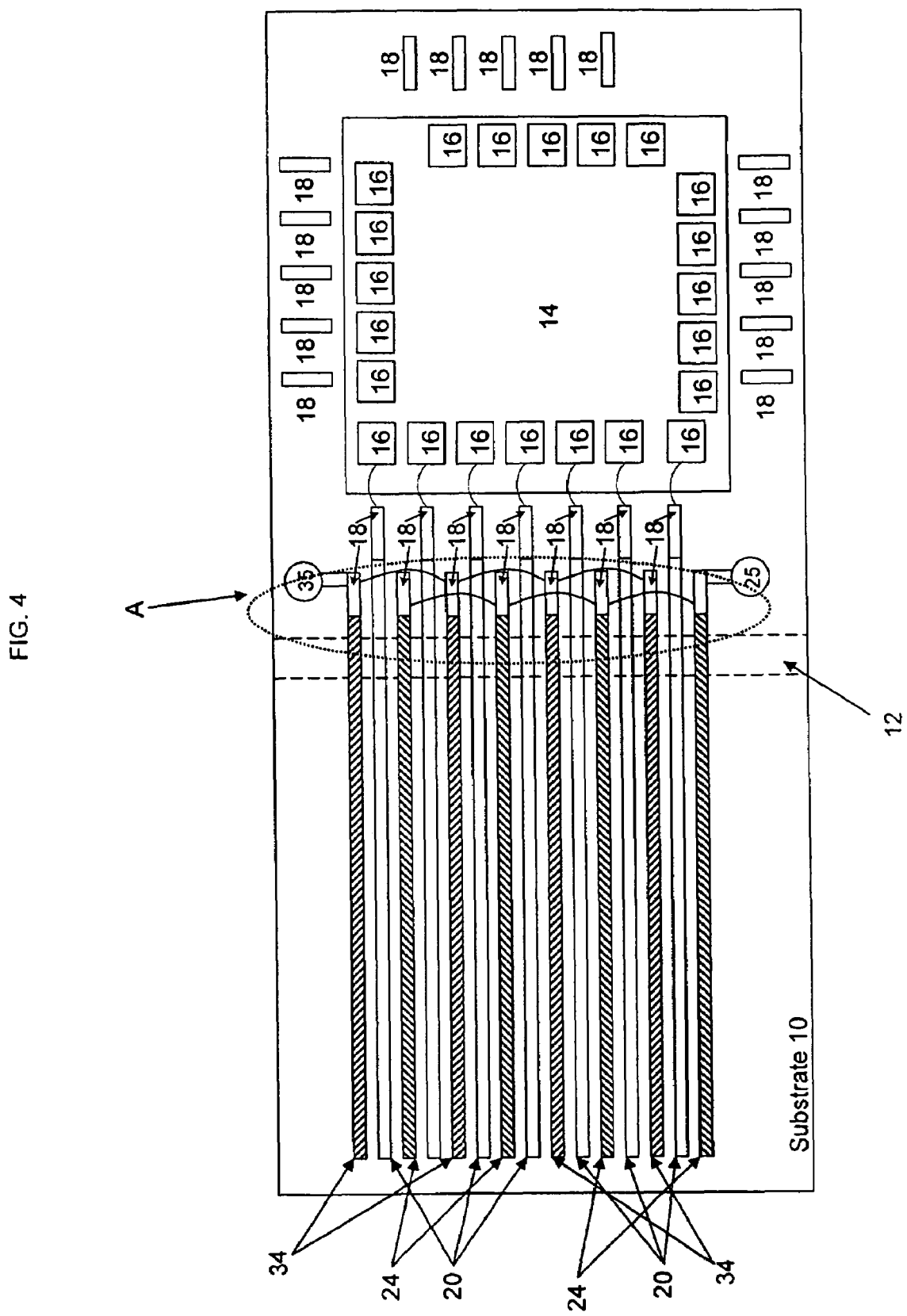
FIG. 4 is a plan diagram illustrating an apparatus according to some embodiments of the invention.

FIG. 4 is a plan diagram illustrating an apparatus according to some embodiments of the invention. The apparatus includes a flexible substrate 10 that is foldable about the folded region 12, a die 14, a number of signal pads 16 located on the periphery of the die 14, and a number of bond fingers 18 on the substrate 10 that correspond to one of the signal pads 16.

It should be apparent that alternative embodiments of the invention may use a standard rigid substrate or a rigid printed circuit board.

A number of signal traces 20 are connected to a corresponding bond finger 18, which in turn is connected to a corresponding signal pad 16 by a jumper wire bond 9. Each of the signal traces 20 is shielded by a power trace 24 and a ground trace 34, the signal traces 20 being arranged so that each lies between a power trace 24 and a ground trace 34.

Figure 2:
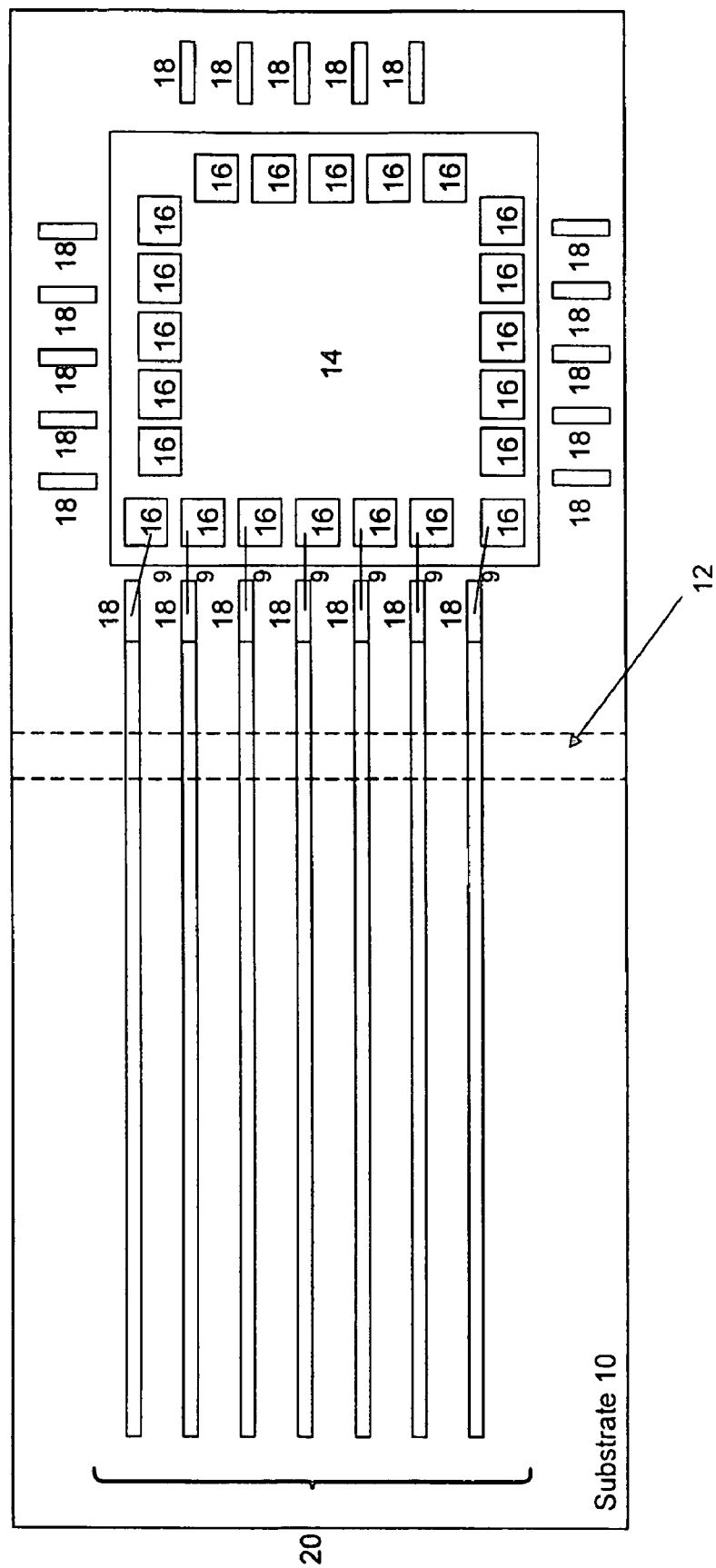
FIG. 2 is a plan diagram illustrating unshielded signal traces on a conventional substrate.
Figure 3:
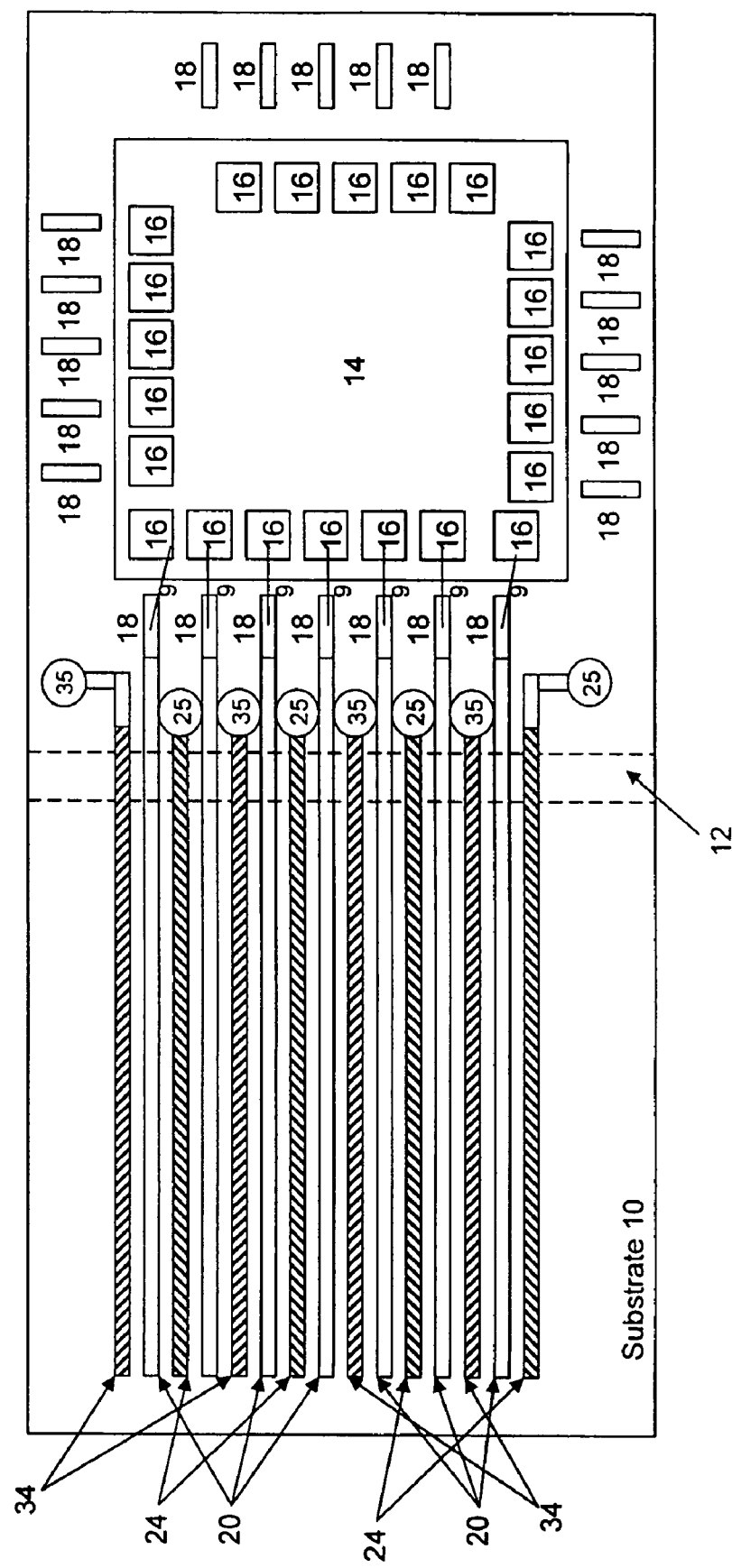
FIG. 3 is a plan diagram illustrating shielded signal traces on a conventional substrate.

Rather than having a number of power vias 25 and ground vias 35 as shown in FIG. 3, some embodiments of the invention have a single power via 25 and a single ground via 35, as shown in FIG. 4. The power via 25 and the ground via 35 are located near the edge of the substrate 10, and are each connected to a bond finger 18. The power trace 24 that lies closest to the power via 25 is connected to the same bond finger 18 as the power via 25. Likewise, the ground trace 34 that lies closest to the ground via 35 is connected to the same bond finger as the ground via 35. The remaining power traces 24 and ground traces 34 are connected to bond fingers 18 that are formed in between the signal traces 20.

In order to supply the power voltage to the interior power traces 24, embodiments of the invention connect the bond fingers 18 at the ends of each power trace 24 together using a jumper wire bond 9. Similarly, ground voltages are supplied to the interior ground traces 34 by connecting the bond fingers 18 at the end of the ground traces 34 together using jumper wire bonds 9. Thus, all of the power traces 24 are electrically connected to the single power via 25 and all of the ground traces 34 are electrically connected to the single ground via 35. These connections are facilitated by using wire bonding to bridge over existing traces.

Figure 5:
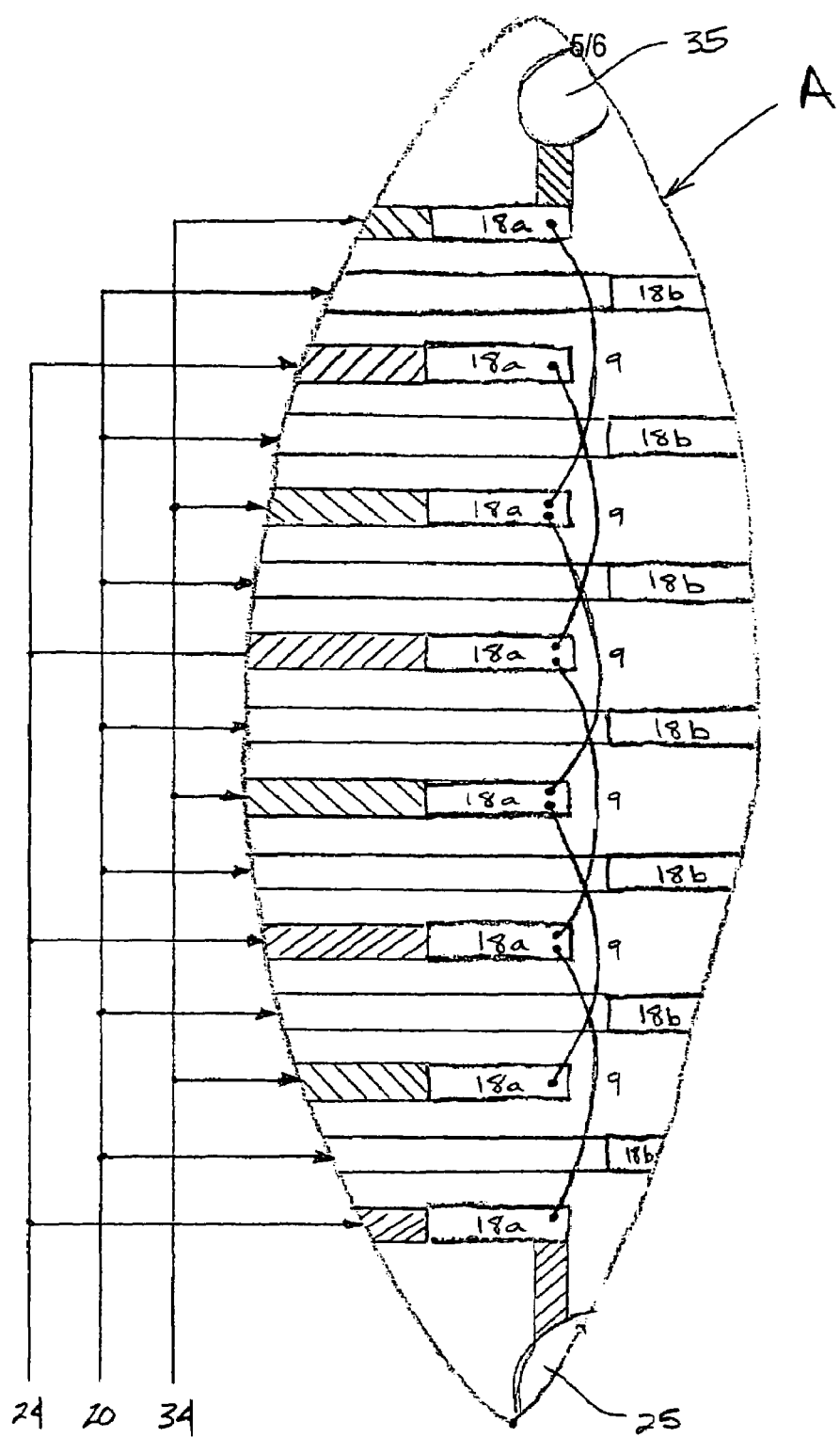
FIG. 5 is a close-up diagram illustrating region A of FIG. 4.

FIG. 5 is a close-up diagram illustrating region A of FIG. 4. FIG. 5 illustrates in more detail the how the power traces 24 and ground traces 34 are each connected to a bond finger 18a. The other bond fingers 18b are connected to a corresponding signal pad (not shown) on the die (not shown). Each of the signal traces 20 are shielded because they are arranged between a ground trace 34 and a power trace 24. The power via 25 is connected to a bond finger 18a of the nearest power trace 24. The ground via 35 is connected to a bond finger 18a of the nearest ground trace 34. The bond-fingers 18a corresponding to power traces 24 are electrically interconnected with jumper wire bonds 9. The bond-fingers 18a corresponding to ground traces 34 are also electrically interconnected with jumper wire bonds 9.

Although it is advantageous to locate the power via 25 and the ground via 35 in close proximity to the outermost bond fingers 18a, other embodiments of the invention may locate the vias 25 and 35 in other locations depending on other routing constraints.

The embodiments of the invention illustrated in FIGS. 4 and 5 are directed at applications where shielding of a signal trace 20 between a ground trace 34 and a power trace 24 is desired. In general, however, embodiments of the invention also provide an improved method of routing signal traces on a substrate.

Figure 6A:
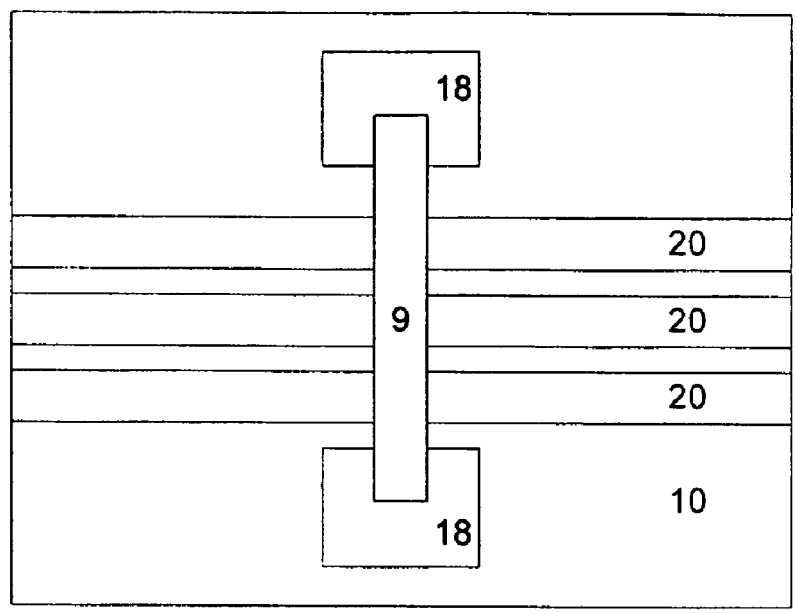
FIG. 6A is a plan diagram illustrating the improved trace routing capability provided by embodiments of the invention.
Figure 6B:
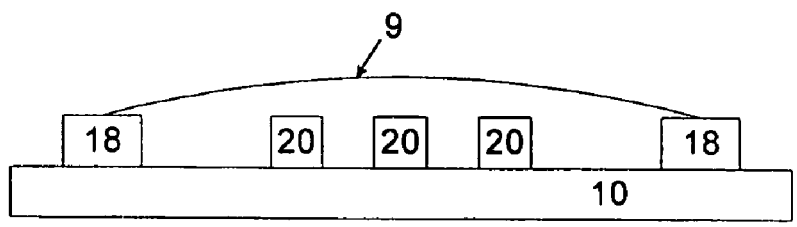
FIG. 6B is a cross-sectional diagram corresponding to FIG. 6A.

FIG. 6A is a plan diagram illustrating an example of the improved trace routing capability provided by embodiments of the invention. FIG. 6B is a cross-sectional diagram corresponding to FIG. 6A.

Referring to FIGS. 6A and 6B, two bond fingers 18 are connected with a jumper wire bond 9, thereby bridging the signal traces 20. Accordingly, power, ground, or other desired signals may be provided to various locations of the substrate 10 without requiring rerouting of the signal traces 20. Although not shown in FIGS. 6A and 6B, at least one of the bond fingers 18 may be connected to a trace, or it may be connected to a via or another bond finger with another jumper wire bond 9, in order to provide a signal to both of the bond fingers 18.

Typically, as shown in FIGS. 6A and 6B, a power signal may be routed from one bond finger 18 to another bond finger 18 using a jumper wire bond 9 that bridges a number of signal traces 20. In alternative embodiments of the invention, the signal traces 20 may be replaced by ground traces, power traces, or any combination of ground, power, and signal traces 20. Likewise, the bond fingers 18 connected by a jumper wire bond 9 could carry a different desired signal (such as ground).

By using embodiments of the invention as illustrated in FIGS. 4, 5, 6A, and 6B, signal traces may be effectively shielded and power delivery may be improved without impacting the signal trace routing on any metal layer of the substrate 10, regardless of whether the substrate is a two-layer substrate or a four-layer substrate.

Compared to FIG. 3, embodiments of the invention replace most of the power vias 25 and most of the ground vias 35 with bond fingers 18. The bond fingers 18 may easily be placed between the signal traces 20 because they are typically around 80 µm in width as opposed to the 250 µm diameter of the vias.

One of ordinary skill in the art will recognize that the concepts taught herein can be tailored to a particular application in many other advantageous ways. In particular, those skilled in the art will recognize that the illustrated embodiments are but one of many alternative implementations that will become apparent upon reading this disclosure. For instance, only the signal pads 16 on one edge of the die 14 are connected to the signal traces 20 in accordance with the embodiments illustrated in FIG. 4. However, it will be recognized that signal pads 16 on two or more edges of the die 14 could be connected to signal traces 20 and that the substrate 10 may have a substantially different shape yet still fall within the scope of the appended claims.

Many of the specific features shown herein are design choices. The number of signal traces, power traces, ground traces, power vias, ground vias, bonding fingers, signal pads, metal layers in the substrate, and semiconductor dies are all merely presented as examples. Furthermore, the shape and size of the substrate and the above-mentioned elements and their location with respect to each other may also be different than what is illustrated in FIGS. 4 and 5. Such minor modifications are encompassed within the embodiments of the invention, and are intended to fall within the scope of the claims.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

We claim:

1. An apparatus comprising:
a substrate;
signal traces disposed on a surface of the substrate;
ground traces disposed on the surface of the substrate;
at least one ground via at the surface of the substrate, the ground traces electrically interconnected to each other with wire bonds and connected to the at least one ground via;
power traces disposed on the surface of the substrate; and
at least one power via, the power traces electrically interconnected, at the surface of the substrate, to the at least one power via.

2. The apparatus of claim 1, wherein the power traces are electrically interconnected to each other with jumper bond wires.

3. The apparatus of claim 1, the substrate further comprising a metal layer disposed beneath the surface of the substrate.

4. The apparatus of claim 1, each of the signal traces in contact with a corresponding signal trace bond finger, each of the ground traces in contact with a corresponding ground trace bond finger, each of the power traces in contact with a corresponding power trace bond finger, wherein a width of the signal traces, a width of the ground traces, and a width of the power traces are substantially the same as a width of the signal trace bond fingers, a width of the ground trace bond fingers, and a width of the power trace bond fingers, respectively.

5. The apparatus of claim 1, wherein the substrate is chosen from the group consisting of a flexible substrate, a rigid substrate, and a printed circuit board.

6. The apparatus of claim 1, the number of the power traces more than the number of the at least one power via, the number of the ground traces more than the number of the at least one ground via.

7. The apparatus of claim 6, the number of the at least one power via equivalent to one, the number of the at least one ground via equivalent to one.

8. An apparatus comprising:
power traces, ground traces, and signal traces arranged on a surface of a substrate, the signal traces arranged between the power traces and the ground traces, the substrate including a first metal layer and a second metal layer arranged beneath the surface of the substrate;
a power via extending from the surface of the substrate to the first metal layer, the power traces electrically connected to the first metal layer by the power via; and
a ground via extending from the surface of the substrate to the second metal layer, the ground traces electrically connected to the second metal layer by the ground via;
wherein the power traces are electrically connected to each other with first wire bonds.

9. The apparatus of claim 8, wherein the ground traces are electrically connected to each other with second wire bonds.

10. The apparatus of claim 8, wherein the signal traces, the ground traces, and the power traces are arranged substantially parallel to each other.

11. The apparatus of claim 8, further comprising:
a die located on the substrate and having signal pads, one of the signal pads electrically connected to a corresponding one of the signal traces.

12. The apparatus of claim 8, further comprising bonding fingers, each power trace and each ground trace attached to a corresponding bonding finger, wherein the ground traces are serially connected at the corresponding bonding fingers, and wherein the power traces are serially connected at the corresponding bonding fingers.

13. An apparatus comprising:
a substrate;
signal traces disposed on the substrate, each of the signal traces connected to a corresponding signal trace bond finger;
ground traces disposed on the substrate, each of the ground traces connected to a corresponding ground trace bond finger, the ground trace bond fingers electrically interconnected with jumper bond wires, and one of the ground trace bond fingers connected to a ground via;
power traces disposed on the substrate, each of the power traces connected to a corresponding power trace bond finger, the power trace bond fingers electrically interconnected with jumper bond wires, and one of the power trace bond fingers connected to a power via.

14. The apparatus of claim 13, each of the signal traces disposed substantially between one of the ground traces and one of the power traces.

15. The apparatus of claim 13, the substrate further comprising metal layers.

16. The apparatus of claim 13, a width of the signal traces, a width of the ground traces, and a width of the power traces are substantially the same as a width of the signal trace bond fingers, a width of the ground trace bond fingers, and a width of the power trace bond fingers, respectively.

17. The apparatus of claim 13, the substrate chosen from the group consisting of a flexible substrate, a rigid substrate, and a printed circuit board.

\* \* \* \* \*